United States Patent
Chang et al.

(10) Patent No.: US 6,969,674 B2
(45) Date of Patent: Nov. 29, 2005

(54) STRUCTURE AND METHOD FOR FINE PITCH FLIP CHIP SUBSTRATE

(75) Inventors: Chien-Wei Chang, Taoyuan Hsien (TW); Sheng-Chuan Huang, Taoyuan (TW)

(73) Assignee: Kinsus Interconnect Technology, Taoyuan (TW)

(*) Notice: Subject to any disclaimer, the term of this patent is extended or adjusted under 35 U.S.C. 154(b) by 0 days.

(21) Appl. No.: 10/932,874

(22) Filed: Sep. 1, 2004

(65) Prior Publication Data

US 2005/0032273 A1    Feb. 10, 2005

Related U.S. Application Data

(62) Division of application No. 10/197,066, filed on Jul. 17, 2002, now abandoned.

(51) Int. Cl.$^7$ ............................................. H01L 21/44
(52) U.S. Cl. ................ 438/613; 438/629; 438/637; 438/639; 438/640; 438/667; 438/668; 438/672; 438/675; 257/737; 257/738; 257/774; 257/778; 257/779; 257/700

(58) Field of Search ................... 438/613, 629, 438/637, 639–640, 667–668, 672, 675; 257/737–738, 257/774, 778–780

(56) References Cited

U.S. PATENT DOCUMENTS

| | | | |
|---|---|---|---|
| 6,352,925 B1 * | 3/2002 | Schrock ..................... 438/687 |
| 6,410,858 B1 * | 6/2002 | Sasaki et al. ............... 174/255 |
| 6,518,513 B1 * | 2/2003 | Enomoto et al. ........... 174/262 |
| 6,531,661 B2 * | 3/2003 | Uchikawa et al. .......... 174/255 |
| 6,591,495 B2 * | 7/2003 | Hirose et al. ................ 29/846 |
| 6,711,812 B1 * | 3/2004 | Lu et al. ...................... 29/852 |
| 6,739,048 B2 * | 5/2004 | Jones et al. .................. 29/852 |

* cited by examiner

*Primary Examiner*—Tom Thomas
*Assistant Examiner*—Edgardo Ortiz

(57) ABSTRACT

The present invention relates to a Fine Pitch flip chip substrate. A black oxide dam is made on the metal circuit between bump pads to replace the conventional solder resist so that the bump pads will not be buried in the solder resist. A small via is drilled by laser drilling and plated filled with copper to be used as the connection between the circuits. By this way, the density and the flexibility of routing could be improved. A mesh pattern can be made in the limited space to increase the stiffness of the substrate.

14 Claims, 7 Drawing Sheets

STRUCTURE AND METHOD FOR FINE PITCH FLIP CHIP SUBSTRATE

CROSS-REFERENCES TO RELATED APPLICATIONS

This is a division of U.S. application Ser. No. 10/197,066, filed Jul. 17, 2002, and now abandoned.

FIELD OF THE INVENTION

The invention relates to a structure and a method of manufacturing a substrate in the semiconductor packaging process, and more particularly to fine pitch flip chip substrates that demand high packaging precision.

BACKGROUND OF THE INVENTION

Due to the increase of the number of I/Os in modern electronic products, the packaging technology has evolved from the early Plug-In method to the more advanced Surface Mounting Technology (SMT) in order to meet the new demands. There are two representative SMT packages, the Dual-In-Line Package (DIP), by Fairchild, and Flat Package (FP), by Texas Instrument Institute. Another packaging method drawing much attention is the Ball Grid Array (BGA), which uses protruding poles arranged in an array to replace the pins of conventional Pin Grid Array (PGA). PGA is a through hole packaging technology that is restricted by the pitch between the separate areas on the printed board. On the other hand, BGA is a surface packaging technology without such restriction. Thus, BGA is suitable for packaging compact products with high density of I/Os. With the emergence of Flip Chip used in high-level products, BGA is becoming the technology of choice in the modern packaging industry. However, in practice, when applying Flip Chip Ball Grid Array (FCBGA) on Flip Chip Substrate, the current BGA technology suffers from the problems of crowed routing space, substrate warpage, and the solder resist too thick to be adhered to the IC devices. It is necessary to develop a different packaging structure and method for solving the aforementioned problems.

As shown in FIG. 1A, a conventional Flip Chip Substrate includes 4 to 8 layers of printed circuit boards. The substrate could be made of ceramic or organic material. The communication between the layers of boards is through the tiny holes drilled mechanically or with laser. Wires are extended through the tiny holes and made into bump pads for connecting the IC bumps. The conventional approach usually requires a larger space; hence, restricts the density and the flexibility of routing. It is desirable to device a technology to fill the tiny laser-drilled holes with plating copper in order to form the communication between the layers of boards. This will improve the density and the flexibility of routing.

In the IC packaging process, the substrates are treated with a high temperature step which could sometimes deform the substrates. The deformed substrates, warped or twisted, are difficult for the IC chips to be adhered on. To avoid heat deformation, the present invention provides a Fine Pitch flip chip substrate with a mesh pattern to increase the stiffness of the substrates. The mesh pattern improves the resistance to heat deformation.

In a conventional IC packaging process, the flip chip substrate is coated with a photo solder resist made of Epoxy to prevent short-circuit of the tin bridge due to the flowing of melted soldering tin during the solder reflow. Also, a bump pad is formed at the area for connecting each solder bump of I/O on the IC chips in the packaging process. This step is difficult for the flip chip substrate that requires its alignment precision to be within 25 $\mu$m. Meanwhile, the thickness of the solder resist is usually controlled between 15 to 45 $\mu$m during manufacturing. Therefore, the bump pads buried in the solder resist will degrade the connection between the IC bumps and the pads on the substrate.

SUMMARY OF THE INVENTION

The present invention provides a Fine Pitch flip chip substrate structure, as shown in FIG. 1B. A black oxide dam is formed on the metal wires between the bump pads to replace the conventional solder resist. The thickness of the dam can be easily controlled between 1–3 $\mu$m such that the bump pads will not be buried in the solder resist. As the present invention is no longer constrained by the alignment precision imposed by the solder resist in the IC connection area, it solves the misalignment problem faced by the conventional technology.

A similar technology to the present invention is to electroplate a NiO layer to form the black oxide resist layer. The thickness of the NiO has to be controlled below 5 $\mu$m. The inherent shortcoming of this method is that the metal wires are not well adherent to the underfill, which is a glue used at the bottom of IC during the FCBGA process. Thus, the reliability is reduced. On the other hand, the present invention grows fur-shaped black oxide dam directly on the wire. This will enhance the adhesion to the underfill, and improve the long term reliability of the circuits. The use of NiO provides no such capability.

The present invention relates to a method comprising the following steps:

Step 1: Providing a Substrate:
  Form a first metal layer on the substrate, on which a plurality of through holes are drilled. A first metal plated layer is formed on the first metal layer and the through holes.

Step 2: Forming an Inner Circuit:
  Transfer image on the dry film and etch the first metal layer and the first metal plated layer according the image to form a plurality of traces, the remaining portion becomes the inner circuit.

Step 3: Black Oxide Inner Circuit:
  Form a black oxide inner circuit in the inner circuit by oxidizing the inner circuit.

Step 4: Forming a Mediate Layer and a Second Metal Layer;
  Introduce dielectric substance into the traces and the through holes of the substrate and coat the entire inner circuit. A metal foil is formed on the dielectric layer and is laminated to become the second metal layer.

Step 5: Forming Vias in the Dielectric Layer by Laser Beams:
  Form a laser mask by transferring an image on the dry film. Vias are drilled by laser drilling at the opening of the laser mask to form a plurality of dielectric layer vias. A second metal plated layer is formed in the dielectric layer vias, which are plated and filled by copper to form the surface of the second metal plated layer.

Step 6: Forming a Circuit Layer:
  Make a Ni/Au layer on the second metal layer by using a dry film as a mask and etch the second metal layer according to the image. The remaining portion is the circuit layer.

Step 7: Forming a Plurality of Solder Resist Areas:
Form the solder resist areas on the second metal layer excluding the bump pad area for IC connection.
Step 8: Forming a Plurality of Black Oxide Dams:
Form the black oxide dams on the second metal layer by way of oxidization.
Step 9: Packaging Flip Chip Process:
Underfill the bottom of IC and connect the flip chip bumps with the Ni/Au layer. The through holes of the flip chip substrate are electrically connected to the mediate layer vias.

The primary object of the present invention is to provide a method that improves the routing flexibility on the substrates and reduces the misalignment problem in manufacturing.

The present invention will become more obvious from the following description when taken in connection with the accompanying drawings which show, for purposes of illustration only, a preferred embodiment in accordance with the present invention.

DETAILED DESCRIPTION OF THE INVENTION

Figure 1A:
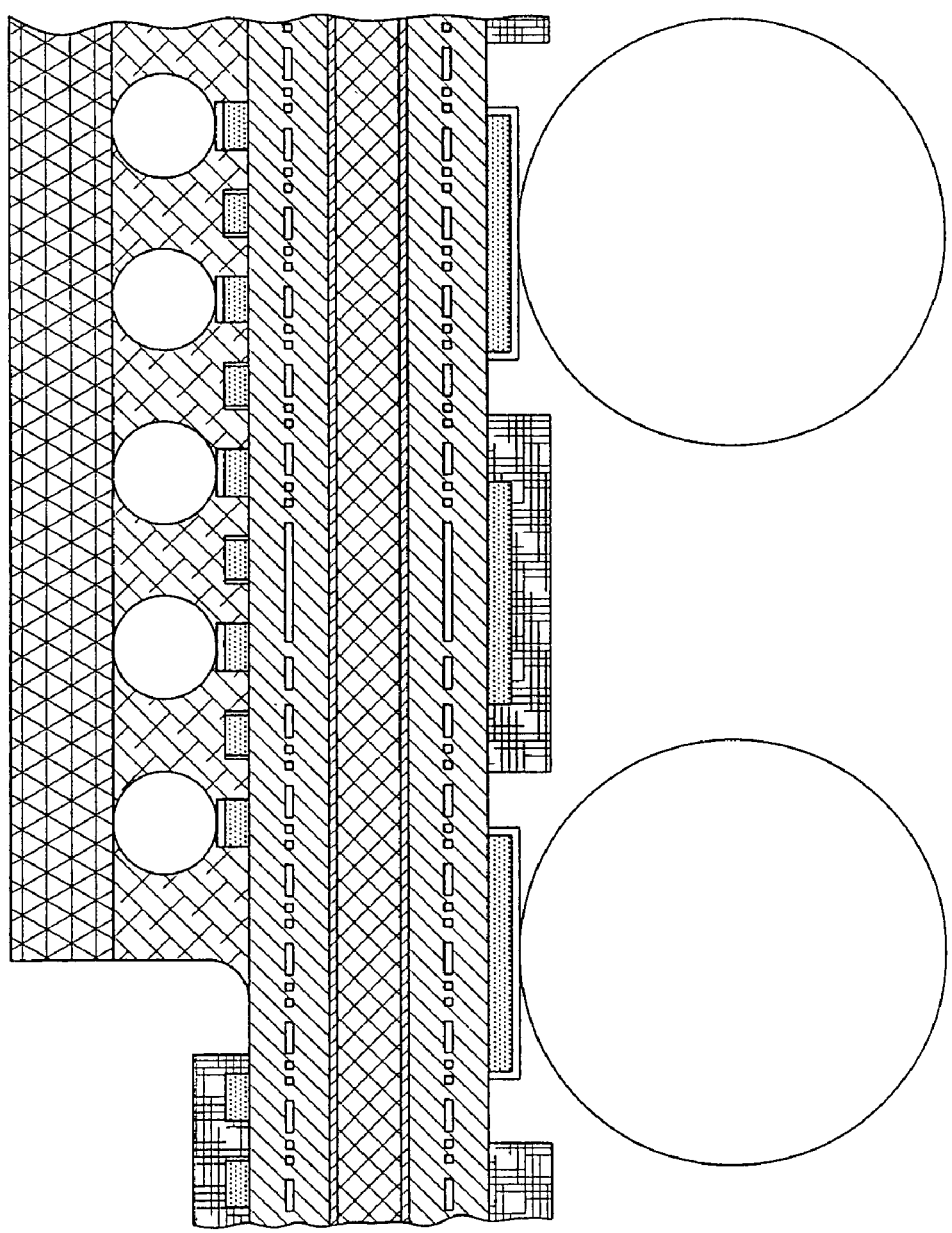
FIG. 1A shows the conventional flip chip substrate.
Figure 1B:
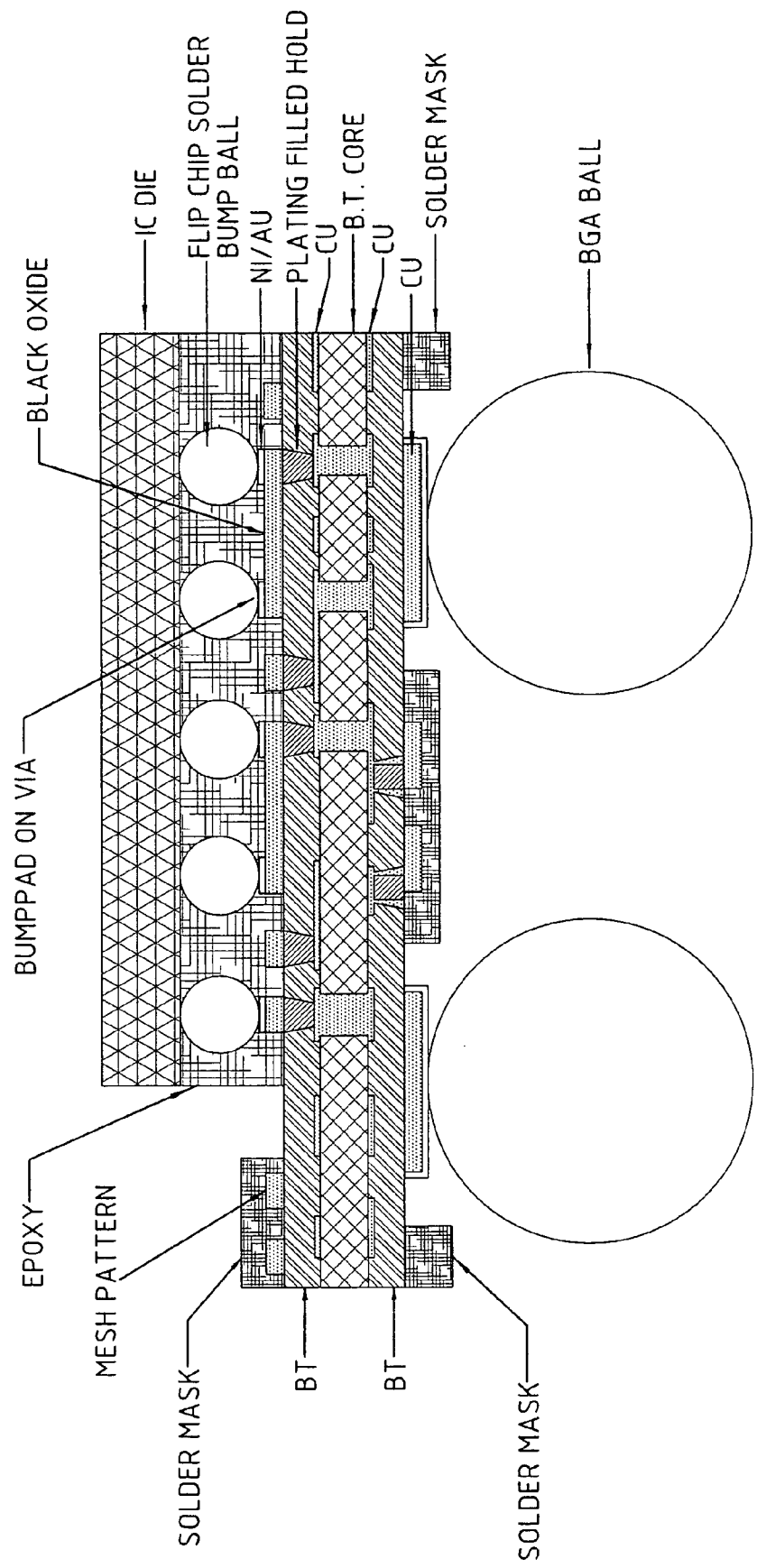
FIG. 1B shows the fine pitch flip chip substrate of the present invention.
Figure 2:
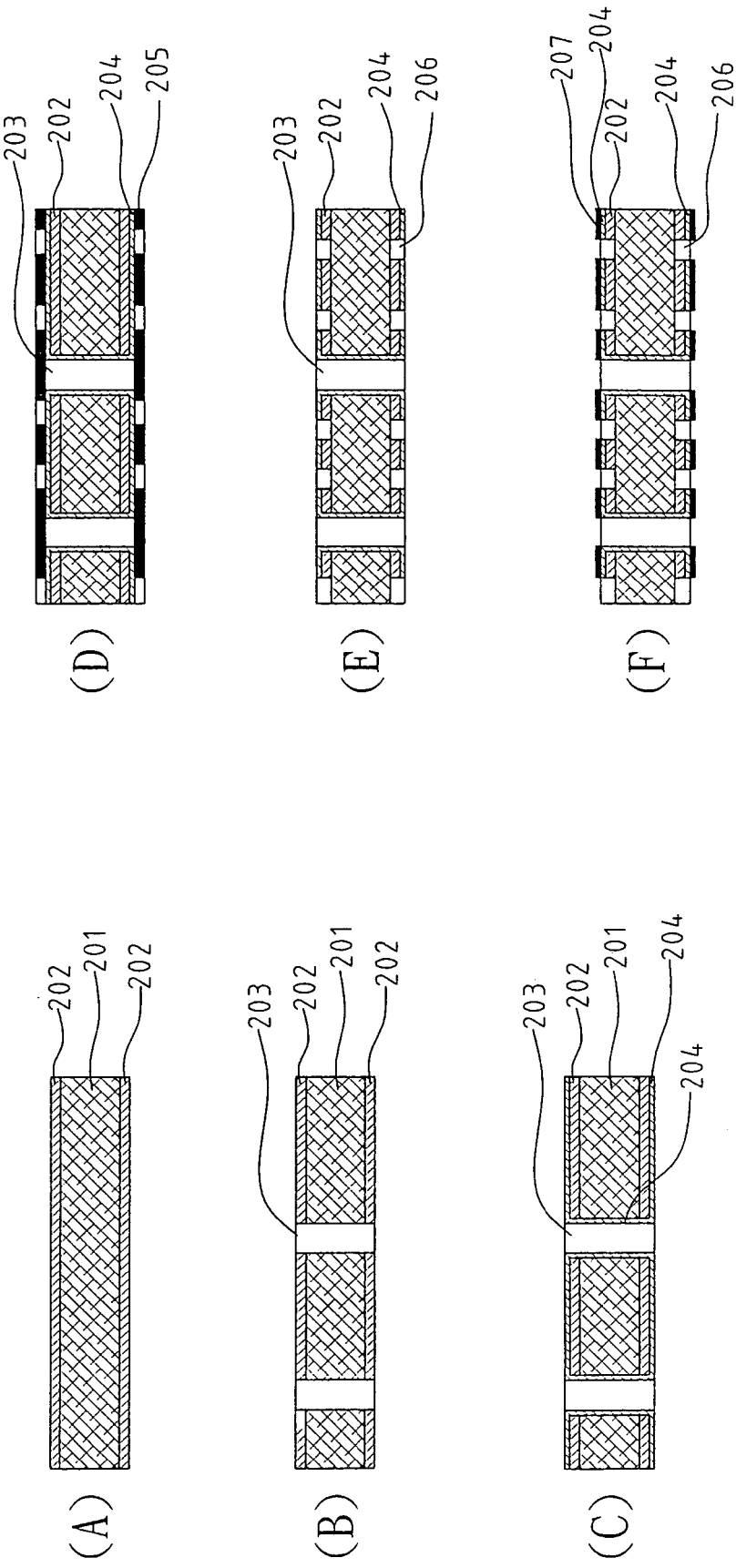
FIGS. 2A to 2U show the steps of the method for making the fine pitch flip chip substrate of the present invention.
Figure 2:
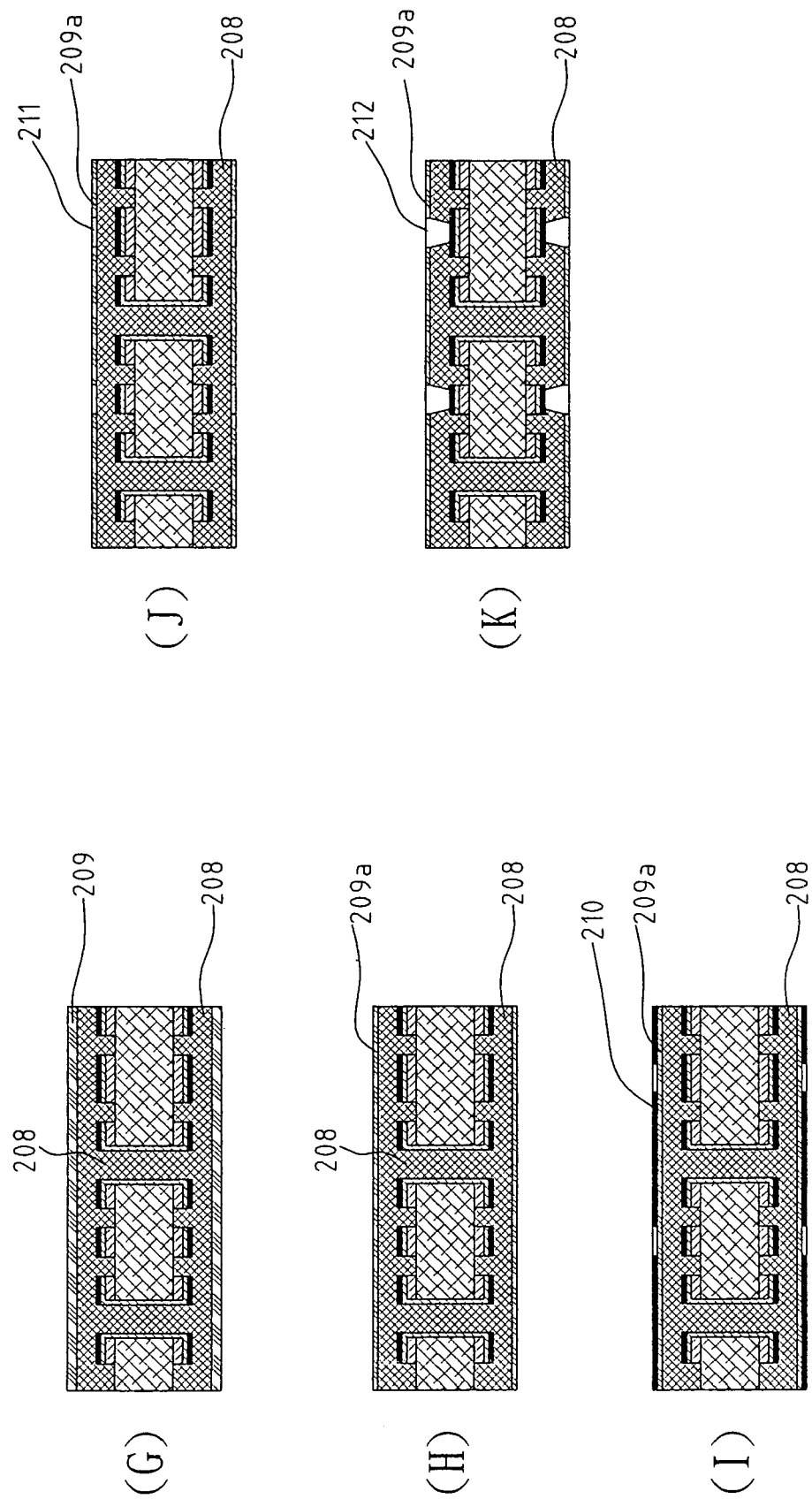
Figure 2:
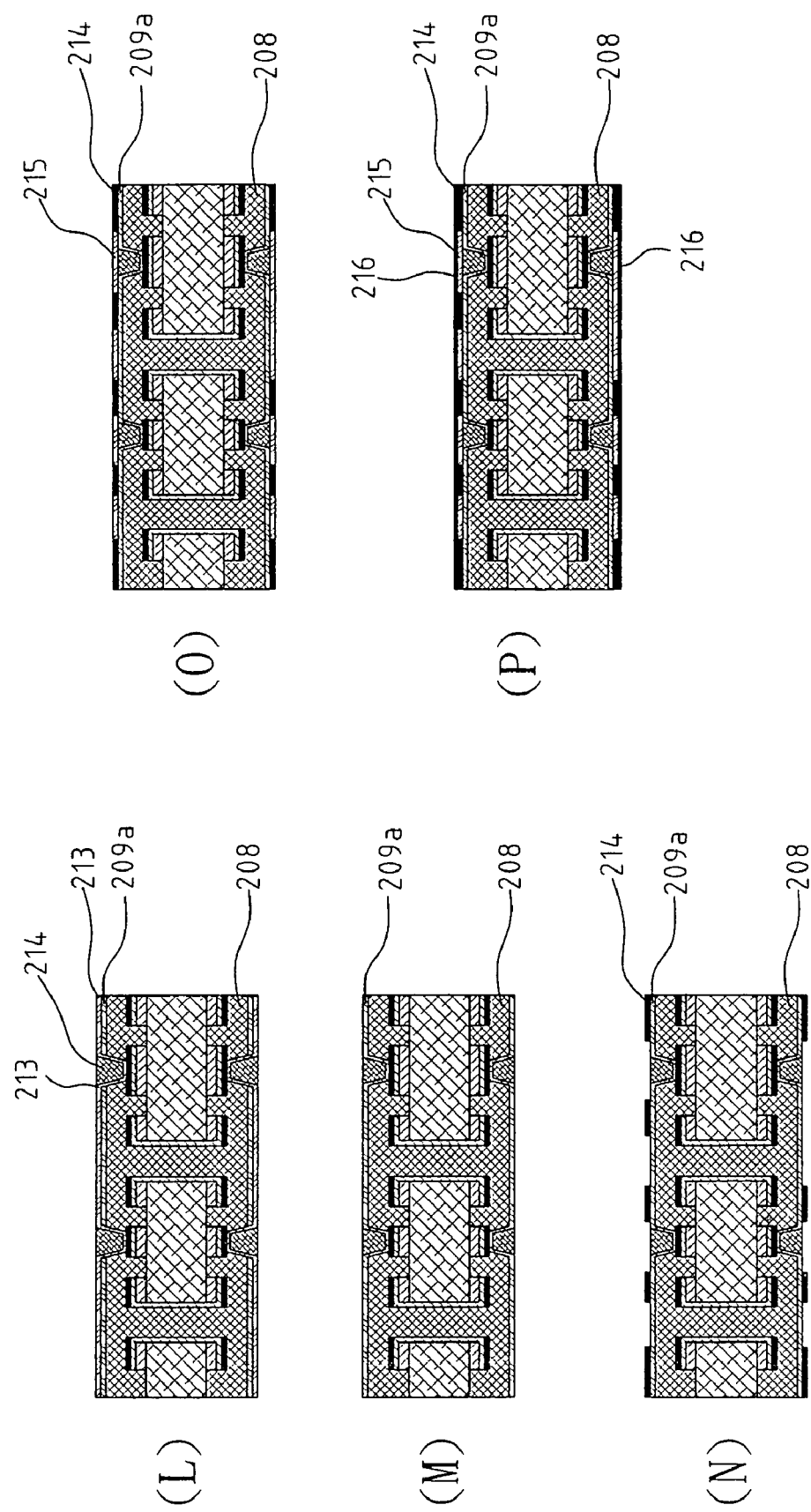
Figure 2:
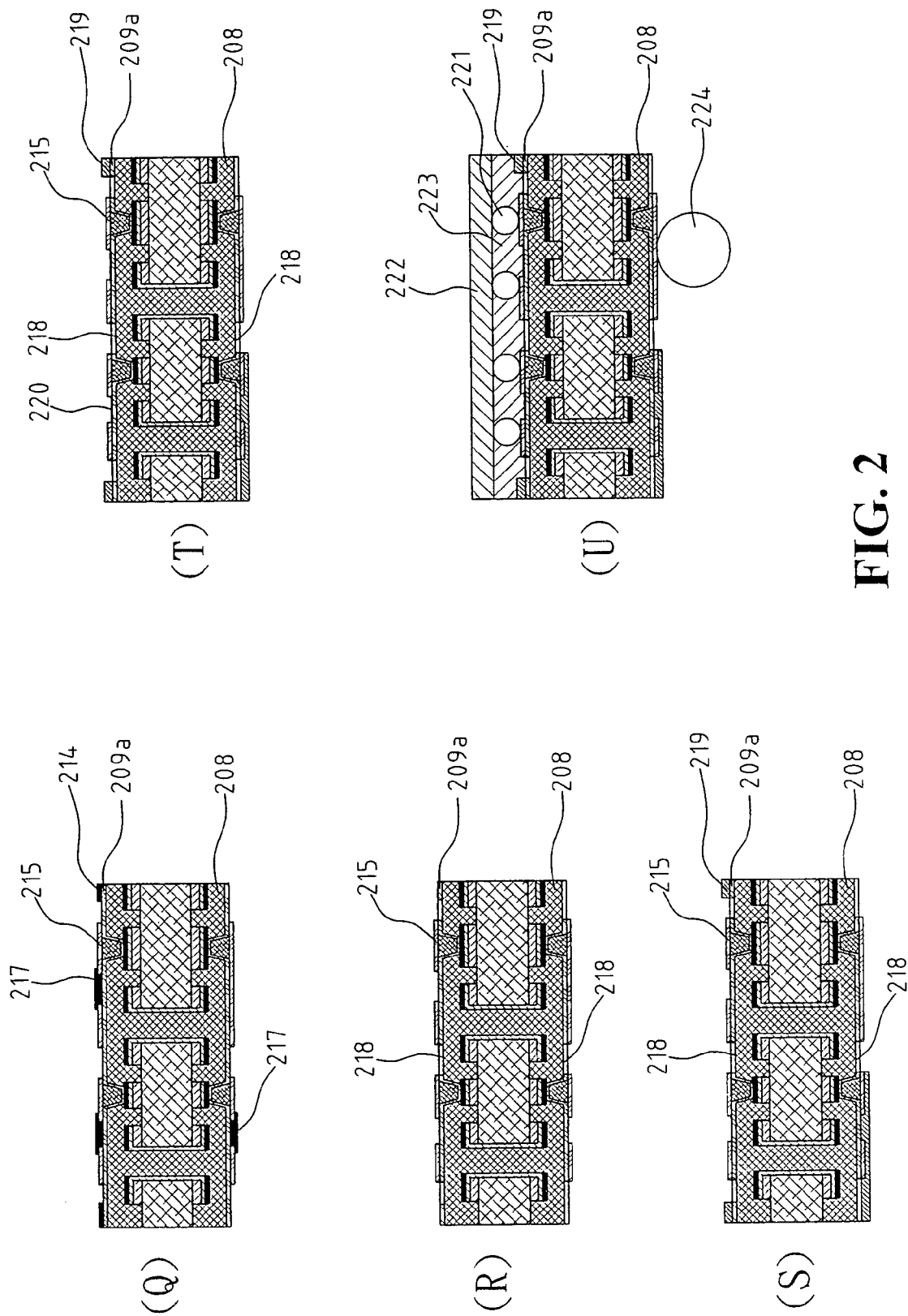

FIGS. 2A to 2T show the steps of the method for making a flip chip substrate including the following steps:

FIGS. 2A to 2C show a process of providing a substrate. FIG. 2A shows a substrate 201 which may be a flip chip substrate and is made of Bismaleimide Triazine (BT), other organic material, or even ceramics. The thickness of 201 is about 0.1 to 0.4 mm. A first metal layer 202 is made on the substrate 201. The first metal layer can be made of Copper (Cu) with a thickness of 12 $\mu$m. FIG. 2B shows a plurality of through holes 203 are drilled on the substrate 201 by mechanical or laser drilling. Each of the through holes 203 has a diameter of 100 to 250 $\mu$m. FIG. 2C shows that a first metal plated layer 204 is formed on the first metal layer 202 and the through holes 203. The first metal plated layer 204 can be made of Copper (Cu) with a thickness of 15 $\mu$m.

FIGS. 2D to 2E show a step of forming an inner circuit. FIG. 2D uses a dry film 205 containing an image to be transferred as the inner circuit, and the dry film is used as a mask. A part of the first metal plated layer 204 and the first metal layer 202 are etched to form traces 206. As shown in FIG. 2E, the remaining portions of the first metal plated layer 204 and the first metal layer 202 are left as the inner circuit.

FIG. 2F shows a step of black-oxidizing the inner circuit. A black oxide inner circuit 207 is formed in the inner circuit by oxidizing the inner circuit.

FIGS. 2G to 2H show a step of forming a dielectric layer and a second metal layer. FIG. 2G shows the lamination of the dielectric material into the traces and the through holes of the substrate by heat pressing and fusion to form a dielectric layer 208 which is coated on the entire inner circuit. The dielectric layer 208 is made of Bismaleimide Triazing (BT) or other dielectric material. A metal foil 209 is formed on the dielectric layer 208. The metal foil 209 can be made of Copper (Cu) with a thickness of 12 $\mu$m. FIG. 2H shows the foil 209 is laminated to form the second metal layer 209a with a thickness of 7 to 9 $\mu$m.

FIGS. 2I to 2M show the step of forming vias in the dielectric layer by laser beams. FIG. 2I shows that the dry film 210 used as a laser mask 211 as shown in FIG. 2J by image transferring. A plurality of dielectric layer vias 212 with a diameter of 100 $\mu$m are drilled by laser drilling at the laser openings of the laser mask as shown in FIG. 2K. A second metal plated layer 213 is formed in the dielectric layer vias 212 and the second metal layer 209a, as shown in FIG. 2L. The dielectric layer vias 212 are filled with plating filled copper 213a. FIG. 2M shows that the second metal plated layer 213 is laminated and the second metal layer 209a has a thickness of 7 to 9 $\mu$m.

FIGS. 2N to 2R show a step of forming a circuit layer. FIG. 2N shows the dry film 214 is used as a mask, and FIG. 2O shows that a Ni/Au layer 215 is coated on the portion that is not covered by the image on dry film 214. The Ni/Au layer 215 is formed by way of electro-plating and has a thickness of 5 $\mu$m. The Ni/Au layer 215 is used as the connection area of flip chip bumps. FIG. 2P shows a liquid photo resist agent or dry film pressing process is used as a mask 216. FIG. 2Q shows the process of image transferring 217, and FIG. 2R shows the etching on the second metal layer 218 wherein the remaining portion is the circuit layer. A mesh pattern is designed in the circuit layer to reinforce the stiffness of the substrate and reduce the heat deformation that could cause substrate warpage or twist.

FIG. 2S shows a step of forming a plurality of solder resist areas. The solder resist areas 219 are formed on the second metal layer, excluding the bump pads area for IC connection. The solder resist 219 can be a photo solder resist coated with Epoxy.

FIG. 2T shows a step of forming a plurality of black oxide dams. The black oxide dams 220 are formed, by way of oxidization, on the second metal layer 209a wherein no etching is applied. The thickness of the black oxide dams 220 is below 1–3 $\mu$m.

FIG. 2U shows the step of packaging flip chip. This includes the step of underfilling 223 to the bottom of IC 222. The flip chip bumps 221 are connected to the Ni/Au layer 215. The through holes of the flip chip substrate are electrically connected to the mediate layer through holes and the BGA tin balls 224.

Figure 3:
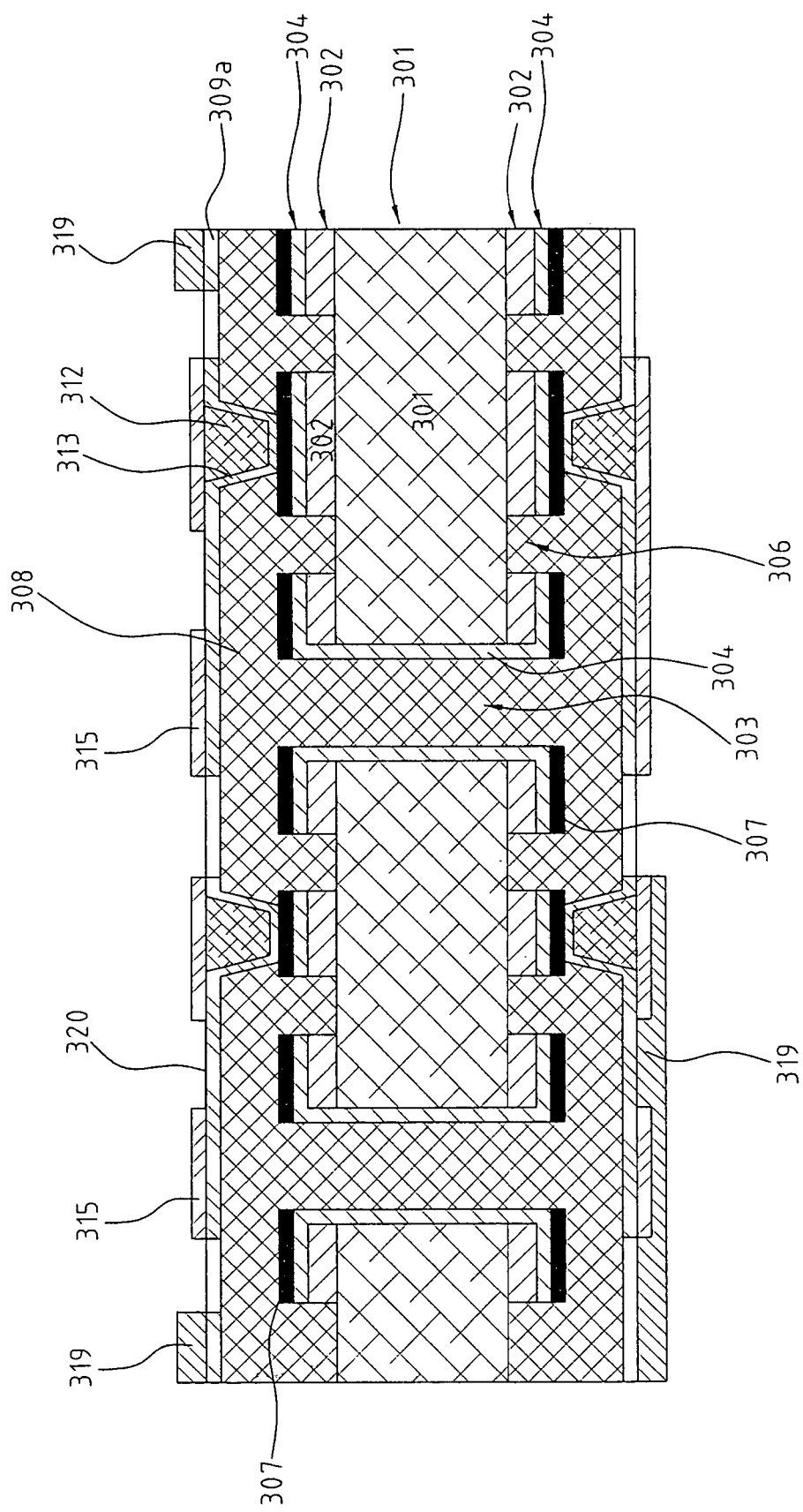
FIG. 3 shows the flip chip substrate of the present invention.

FIG. 3 shows the structure of the flip chip substrate and includes a substrate 301 with a first metal layer 302 on the surface of the substrate and the thickness of the first metal layer 302 is 12 $\mu$m. A plurality of through holes 303 are drilled on the substrate and each has a diameter of 100 to 250 $\mu$m. The first metal plated layer 304 is formed on the surface of the first metal layer 302 and the through holes 303 of the substrate. The thickness of the first metal plated layer 304 is about 15 $\mu$m. An inner circuit is the remaining portion of the first metal plated layer 304 and the first metal layer 302 by an etching process. The etching results into traces 306. A black oxide inner circuit 307 is formed on the surface of the inner circuit. A dielectric layer 308 is formed by laminating dielectric material into the traces 306 and the through holes 303 of the substrate and is coated on the entire inner circuit. A metal foil 309 with a thickness of 12 $\mu$m is formed on the dielectric layer 308. The metal foil 309 is laminated to form a second metal layer 309a which has a thickness of 7–9 $\mu$m. A plurality of dielectric layer vias 312 are made by drilling holes at 100 $\mu$m in diameter with laser. A second metal plated layer 313 is formed in the dielectric layer vias 312 which are filled with plating filled copper. A circuit layer is made by forming a Ni/Au layer 315 on the second metal layer 309*a* and is used to connect the Ni/Au layer and the bumps. The thickness of the Ni/Au is about 5 μm. By etching part of the second metal layer 309*a*, it forms the circuit layer which has a mesh pattern to reinforce the stiffness of the substrate and reduces the heat deformation which could cause substrate warpage and twist. A plurality of solder resist areas 319 are formed on the areas of the second metal layer 309*a* excluding bump pads area for IC connection. A plurality of black oxide dams 320 are formed on the second metal layer 209*a* and each black oxide dam 320 has a thickness of 1–3 μm.

The present invention has the following advantages in comparison with the current technologies:

1. The black oxide dams on the circuit of non-bump pads are able to reduce the thickness of the solder resists, which is a common problem for using the conventional solder resists. In comparison with the requirement of the conventional alignment precision of +/−25 μm, the present invention may have an alignment tolerance up to 50 μm. The plating filled copper reduces the number of the wires and the bump pads pitch is reduced to be 50 μm so as to increase the density of the wires. Therefore, there is enough space for the mesh pattern to improve the packaging quality.
2. The thickness of the black oxide layer of the present invention is about 1–3 μm. In comparison with the conventional requirement of the thickness of the solder resist 25 μm, the clearer shape and the better resolution enable the alignment precision of the present invention to be easily controlled under 20 μm.
3. The conventional photo solder resist usually forms a deep well in the manufacturing process, debris is left at the bottom of the bump pads and affects the quality of packaging. The present invention solves the problem.
4. The high density flip chip bumps are replaced with the black oxide dams in the soldering of the packaging process. The thickness of the plated Ni/Au layer on the bump pad is about 5 μm and the black oxide dam is lower than the bump pad. In comparison with the conventional solder resist having a thickness of 25 μm, which is higher than the bump pad, it is advantageous for the high quality and reliability of the flip chip bumping packaging.
5. The conventional packaging employs a tin-lead solder bump which does not meet the trend of un-leaded environmental green requirement. The present invention meets the requirement.

While we have shown and described the embodiment in accordance with the present invention, it should be clear to those skilled in the art that further embodiments may be made without departing from the scope of the present invention.

What is claimed is:

1. A method for making a fine pitch flip chip substrate, comprising the steps of:
    providing a substrate with a first metal layer, said substrate having a plurality of through holes, and a first metal plated layer on the first metal layer and the through holes;
    forming an inner circuit on said substrate by etching said first metal layer;
    forming a black oxide inner circuit by oxidizing said inner circuit;
    forming a dielectric layer and a second metal layer on said substrate;
    forming vias in the dielectric layer by drilling to form a plurality of dielectric layer vias, which are plated with a second metal plated layer and then filled with plating filled copper;
    forming a circuit layer on said second metal layer, said circuit layer including a plurality of bump pad areas;
    forming a plurality of solder resist areas on said second metal layer outside said bump pad areas;
    forming a plurality of black oxide dams between said bump pad areas on said second metal layer by oxidization; and
    packaging a flip chip by underfilling said bump pad areas, and connecting the through holes of the flip chip substrate and said vias of the dielectric layer.

2. The method as claimed in claim 1, wherein in the step of providing a substrate, the substrate is made of Bismaleimide Triazine (BT), organic material, or ceramics and the thickness of the substrate is about 0.1 to 0.4 mm.

3. The method as claimed in claim 1, wherein in the step of providing a substrate, the first metal layer is made of Copper (Cu) with a thickness of 12 μm.

4. The method as claimed in claim 1, wherein in the step of providing a substrate, the plurality of through holes on the substrate is drilled by mechanical or laser drilling and each of the through holes has a diameter of 100 to 250 μm.

5. The method as claimed in claim 1, wherein in the step of providing a substrate, the first metal plated layer formed on the first metal layer and the through holes is made of Copper (Cu) with a thickness of 15 μm.

6. The method as claimed in claim 1, wherein in the step of forming a dielectric layer and a second metal layer, the dielectric layer is made of Bismaleimide Triazing (BT).

7. The method as claimed in claim 1, wherein in the step of forming a dielectric layer and a second metal layer, the second metal layer comprises a metal foil made of Copper (Cu) with a thickness of 12 μm.

8. The method as claimed in claim 7, wherein in the step of forming a dielectric layer and a second metal layer, the metal foil is laminated to form the second metal layer with a thickness of 7 to 9 μm.

9. The method as claimed in claim 1, wherein in the step of forming vias in the dielectric layer, a plurality of dielectric layer vias with a diameter of 100 μm are drilled by laser drilling and the second metal plated layer is laminated to a thickness of 7 to 9 μm.

10. The method as claimed in claim 1, wherein in the step of forming a circuit layer, the circuit layer is a Ni/Au layer formed by way of electro-plating and has a thickness of 5 μm.

11. The method as claimed in claim 1, wherein in the step of forming a circuit layer, a liquid photo resist agent or dry film pressing process is used as a mask.

12. The method as claimed in claim 1, wherein in the step of forming a circuit layer, a mesh pattern is designed in the circuit layer to reinforce the stiffness of the substrate and reduce heat deformation that could cause substrate warpage or twist.

13. The method as claimed in claim 1, wherein in the step of forming a plurality of solder resist areas, the solder resist areas have a photo solder resist coated with Epoxy.

14. The method as claimed in claim 1, wherein in the step of forming a plurality of black oxide dams, the thickness of the black oxide dams is below 1–3 μm.

* * * * *